United States Patent [19]
Chiluvuri et al.

[11] Patent Number: 6,075,934
[45] Date of Patent: Jun. 13, 2000

[54] METHOD FOR OPTIMIZING CONTACT PIN PLACEMENT IN AN INTEGRATED CIRCUIT

[75] Inventors: Venkata K. R. Chiluvuri; Mohankumar Guruswamy; Srilata Raman; Robert L. Maziasz, all of Austin, Tex.

[73] Assignee: Motorola, Inc., Schaumburg, Ill.

[21] Appl. No.: 08/848,907

[22] Filed: May 1, 1997

[51] Int. Cl.[7] ................................................. G06F 17/50
[52] U.S. Cl. .......................... 395/500.11; 395/500.03; 395/500.15
[58] Field of Search .............. 395/500.11, 500.03, 395/500.09, 500.1, 500.13, 500.15

[56] References Cited

U.S. PATENT DOCUMENTS

| | | | |
|---|---|---|---|
| 4,811,237 | 3/1989 | Putatunda et al. | 395/500.1 |
| 4,903,214 | 2/1990 | Hiwatashi | 395/500.15 |
| 5,272,645 | 12/1993 | Kawakami et al. | 364/491 |
| 5,391,900 | 2/1995 | Onodera et al. | 395/500.09 |
| 5,404,310 | 4/1995 | Mitsuhashi | 364/490 |
| 5,502,649 | 3/1996 | Hirata | 395/500.07 |
| 5,537,328 | 7/1996 | Ito | 395/500.02 |
| 5,648,910 | 7/1997 | Ito | 395/500.03 |
| 5,689,432 | 11/1997 | Blaauw et al. | 395/500.19 |
| 5,818,727 | 10/1998 | Sekiguchi | 395/500.19 |

*Primary Examiner*—Kevin J. Teska
*Assistant Examiner*—Leigh Marie Garbowski

[57] ABSTRACT

A method for optimizing contact pin placement in an integrated circuit, wherein a netlist containing connectivity information, and placement information for a semiconductor circuit is read. Each net in the circuit is classified (510). Unblocked tracks are identified for each net in the circuit (512). All contact pins associated with nets having a power supply classification are placed according to a power supply location (513). The blockage for each remaining net is updated. Next, all contact pins for nets residing within a defined diffusion are placed (514) The blockage for each remaining net is updated. Next, all contact pins for nets residing in multiple defined diffusion areas are placed (515).

20 Claims, 7 Drawing Sheets

METHOD FOR OPTIMIZING CONTACT PIN PLACEMENT IN AN INTEGRATED CIRCUIT

FIELD OF THE INVENTION

The present invention relates generally to integrated semiconductor circuits, and specifically to a method for optimizing contact pin placement in source/drain regions of an integrated circuit.

BACKGROUND OF THE INVENTION

In standard cell layout synthesis, routing is performed in several stages. In one stage, contact pin locations for source and drain connections of transistors are identified and contacts are generated to allow metal interconnections to electrically connect to the source/drain areas.

Supply nets, which connect the transistors to power and ground, are generally routed in specific routing layers prior to the routing of signal nets. During subsequent stages of routing, an area router is used to complete connecting signal nets and any remaining supply nets, typically using polysilicon and metal-1 interconnection layers. The placement of source/drain contact pins has a significant impact upon the quality of final routing of a standard cell design.

For example, referring to prior art FIG. 1, assume the net labeled NET-1 105 was the first net selected to be routed following the placement of all of the contact pins within the standard cell portion 100, and routed as indicated in FIG. 1 using a metal-1 interconnection layer. Subsequently, NET-2 107 was routed producing the layout indicated in FIG. 1. As a result of the contact pin labeled 110 residing directly between the contact pins labeled 120 and 121, the NET-1 105 cannot connect the contact pins 120 and 121 to each other with a straight interconnection for NET-1 105. As a result, the router uses vertical interconnection to avoid, or jog around, the contact 110 and routes interconnection into the area between the PMOS diffusion 102 and the NMOS diffusion 104 in order to complete the net connection. Next, NET-2 107 is routed.

The routing of NET-2 107 required the interconnection to go around NET-1 105. When contrasted to prior art FIG. 2 which illustrates the same example where the NET-2 was the first net to be routed, it can be seen that the length of the routed NET-2 207 is much less than the length of the routed NET-2 107 of FIG. 1, while producing a NET-1 205 having a length equal to that of NET-1 105 of FIG. 1.

One prior art method of overcoming the dependency on routing order is for a user to specifically indicate that the NET-2 needs to be routed before the NET-1. However, this is often not possible in that a user often does not have visibility to the relationships between the nets prior to the routing steps, and there could be a large number of nets making it difficult to prioritize nets optimally. Subsequent analysis of the attempted routing would allow for a user to define specific net routing priorities such that a second pass at routing could perform a better result. However, this manual intervention is inefficient use of time and often results in significant time delays.

The use of post-processing reroute is another technique used to optimize the layout of semiconductor circuits. Post-processing reroute occurs following an attempt to route all nets within a design circuit. During post-processing reroute, nets are individually analyzed to determine whether or not they can be routed in a more efficient manner. For example, for the circuit of FIG. 1, a post-processing reroute would determine that NET-2 107 can be more efficiently rerouted by first removing the routed NET-1 105 and then rerouting the NET-2 107. Following the rerouting of the NET-2 the NET-1 would then in turn be rerouted and the better result of FIG. 2 can be obtained.

However, the use of post-processing reroute is a time and resource consuming process which does not improve router access to the contact pins. Referring to the prior art FIG. 1, the pins 120, 110, and 121 are arranged as such that the router access to pin 110 is available only from top and bottom directions and not from the left and right. Even in the optimal routing as illustrated in FIG. 2, the router in the routing of NET-1 had to go around the contact pin 210 in order to make a connection between the pins 220 and 221. The need to route around other contact pins illustrates limited router access which is a function of contact pin placement.

Another known contact placement technique is to specify contact to a predefined location for each source/drain area. For example, the contact pin location where routing is to occur can be predefined to be at the center or the top or bottom edge of a drain/source area. Standard cell synthesis tools using channel routing have used the contact pin placement in the center of the source/drain region and metal interconnections from contact pins to the channel edge, allowing subsequent channel routing. As a result of this generic placement of contact pins, router access to these pins is often diminished.

Therefore, the ability to automatically optimize a placement of source/drain contact pins in order to improve router access, reduce routing dependency upon net ordering and minimize the number of routing tracks used by a router would be beneficial.

BRIEF DESCRIPTION OF THE DRAWINGS

The present invention is illustrated by way of example and not limited in the accompanying figures, in which like references indicate similar elements, and in which.

Skilled artisans appreciate that elements in the figures are illustrated for simplicity and clarity, and have not necessarily been drawn to scale. For example, the dimensions of some of the elements in the figures are exaggerated relative to other elements to help to improve understanding of embodiment(s) of the present invention.

DETAILED DESCRIPTION OF THE DRAWINGS

The present invention optimizes the placement of contact pins within an integrated circuit, and generally for a standard cell in a standard cell library. A standard cell is understood to be a specific logic function generally associated with a larger standard cell library having many individual standard cells. However, the present invention can be used for other circuits besides standard cells where contact pin placement optimization would be beneficial. For example, a large design specifying macros can use the contact pin placement methods described herein in order to optimize the overall "macro design". The term macro generically refers to a circuit portion implementing a defined function which is generally used as a "block" in a larger design. By designing, optimizing, and testing individual macros, their functionality in larger designs is assured. For purposes of discussion, the term "standard cell" or "cell" will be used.

Figure 3:
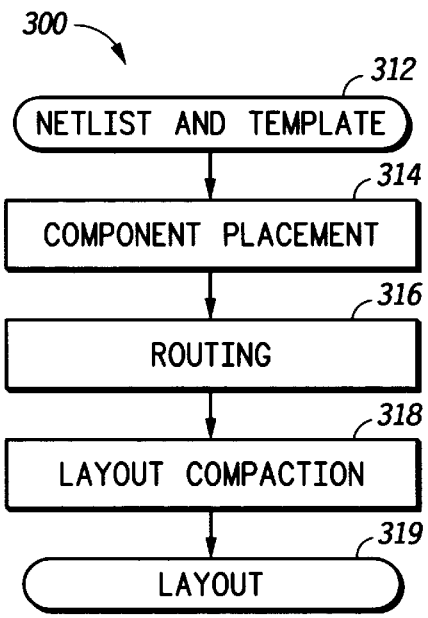
FIG. 3 illustrates, in flow diagram form, a general method for cell layout generation in accordance with the present invention.

FIG. 3 illustrates a broad method 300 for optimally placing contact pins in accordance with the present invention. At step 312 a netlist and template are inputs provided by a user. The netlist includes the various devices, their sizes and the connectivity information between the individual contact pins of each standard cell. In addition, the template provided by the user includes information specific to the standard cell library including parameters such as specific heights associated with individual library components, library cell heights, and other library definitions. Next, at step 314, a component placement is performed for a given standard cell, which includes the placement of the transistors implementing the standard cell function, as well as the placement of the standard cell's input ports, output ports and other structures associated with the standard cell.

Next, at step 316, a routing step occurs. The routing step 316 includes the placement of the source/drain contacts pins for the transistors specified in step 314, and a subsequent step of determining where interconnection wiring connecting contacts will be placed. Next, at step 318, a layout compaction step occurs wherein the design layout generated by routing in step 316 is optimized. Finally, at step 319, a completed layout of the standard cell using the method 300 is generated.

Figure 4:
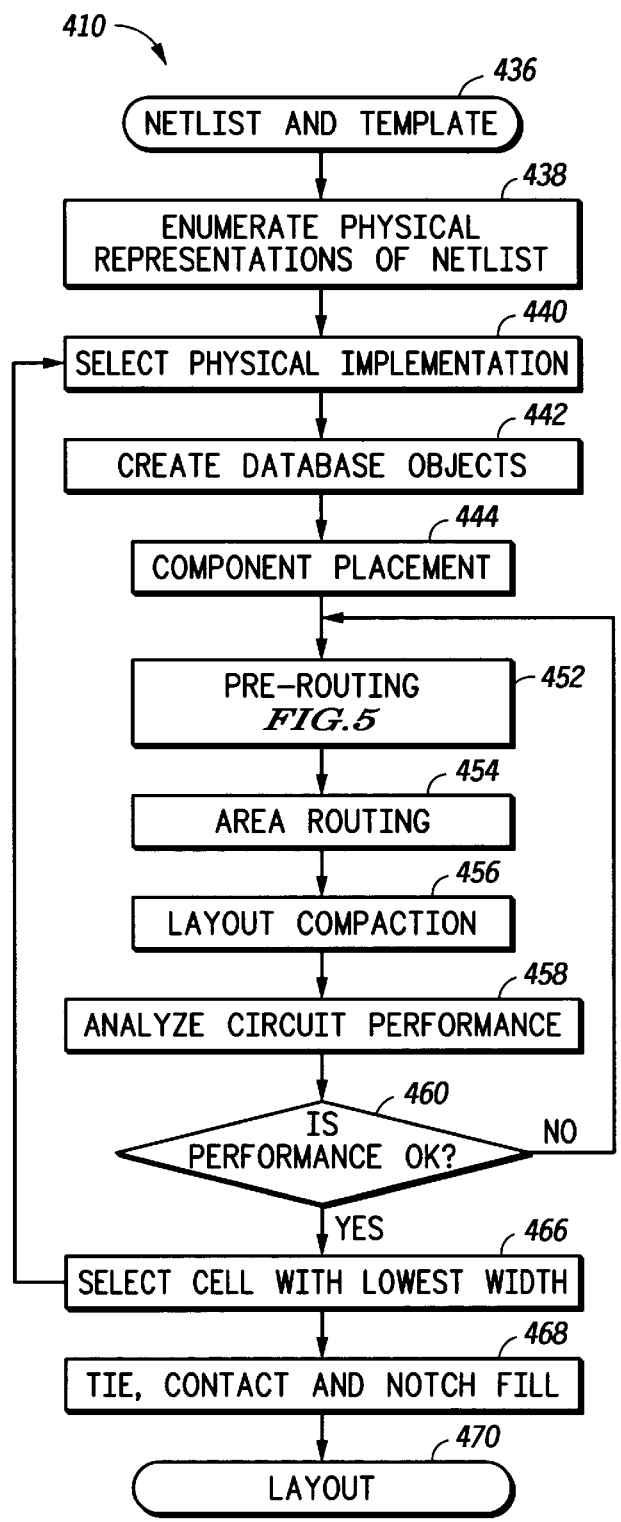
FIG. 4 illustrates, in flow diagram form, the general method of FIG. 3 in greater detail.

The individual steps of component placement, routing, and layout compaction, are portions of an automatic standard cell layout generator program which performs these steps as part of a standard cell synthesis. Advantages of using such a tool include improving cycle time of developing individual standard cell libraries comprised of the individual standard cells. FIG. 4 illustrates an expanded version of the steps outlined in FIG. 3.

FIG. 4 illustrates a method 410 for cell layout generation. In first step 436, a netlist, a layout template and process design rules are inputs provided from an external memory source. Next, at step 438, a physical representation of the netlist is enumerated. In step 438, the logical input netlist received in step 436 is transformed into several physical netlists which are functionally similar, but structurally distinct. For example, the physical netlist may include a different number of transistors or connections. The logical input netlist may be transformed into the physical netlist by a process commonly known as transistor folding, or by unfolding, or by other processes known in the art. Each of these folded netlists will produce a different cell layout structure. These folded netlists are then ordered based on increasing estimated cell widths and processed by succeeding stages in cell layout generator method 410.

In subsequent step 440, a physical implementation is selected by cell layout generator 410. Once each of the folded netlists arise ordered, cell layout generator 410 selects a cell structure which is most likely to comply with a specified cell height as determined by the template input in step 436. Cell layout generator 410 moves from a first one of the folded netlist to a next in the order established in step 438 until the best compliant layout is determined.

Next, in step 442, database objects are created by generating an actual physical layout of the transistors specified by the folded netlist. It should be noted that there are many different types of objects which may be created. For example, there are active devices such as transistors, and there are also ports, diodes, and ties. Additionally, other objects not specifically discussed herein may also be created by this invention.

After the database objects have been created, component placement, such as transistor placement, is performed in step 444. Transistors are ordered in a two-dimensional array to minimize an interconnection length and cell area required in the layout. The methodology used in step 444 supports a variety of layout styles such as Multiple Rows Of Transistor Regions And Transistor Regions With Vertically Stacked Devices.

After the components are placed, pre-routing is performed as step 452. In pre-routing step 452, sources and drains of adjacent transistors which receive the same signal are connected with diffusion wiring. Diffusion contact pins are also added to the source and drain connections if other connections to non-adjacent gates, sources, or drains are required.

Subsequently, area routing is performed as step 454. In area routing step 454, all of the signals connecting the active devices, ports, diodes, and ties are routed in accordance with the layers specified in a template provided in step 436. Each routing layer is given preference in wiring direction and cost parameters to control wiring length and a number of vias. In the area routing technique implemented by the present invention, routing is accomplished by a combination of maze search, layer assignment, and rip-up-and-reroute heuristics.

After connections between the transistors, ports, diodes, and ties are completed, a resulting layout must be compacted to provide for the most efficient area utilization possible. Compaction is accomplished in step 456. Next, in step 458, the layout area of critical interconnections are analyzed for performance. In general, larger area of certain layout elements, such as diffusion or polysilicon, indicates slower circuit performance which may be unacceptable. If this is the case with the layout chosen in step 454, the layout is reverted back to step 452, with the same component placement as before. Modified steps of pre-routing step 452, area routing step 454 and layout compaction step 456 are attempted until a satisfactory layout is obtained in step 460.

The cell with a lowest width and that meets the library height requirement is then determined in step 466. This cell is determined from all physical implementations generated from steps 442 through step 460. After the cell with the lowest width is determined, a step of tie, contact, and notch filling is executed.

Tie, contact, and notch filling is then performed an step 468. Tie filling step 468 may be required to be executed, as compaction step 456 does not guarantee satisfaction of tie-coverage design rules. Step 468 is designed to add substrate and well tie diffusion wherever possible without violating design rules. This step enhances tie coverage and performance of the final layout without increasing cell area. Finally, notch and contact filing are performed. Notch filling adds geometry to prevent internal and external notch errors. contact filling identifies diffusion areas that can accommodate metal contacts in order to minimize resistance and increase circuit performance.

As a result of executing each of steps 438 through 468, a cell layout is generated in step 470. It should be noted that the methodology disclosed herein is a fully automated process and does not require external user intervention or manual manipulation of the layout design. As such, both latency associated with layout development and overhead costs are also significantly decreased.

Figure 5:
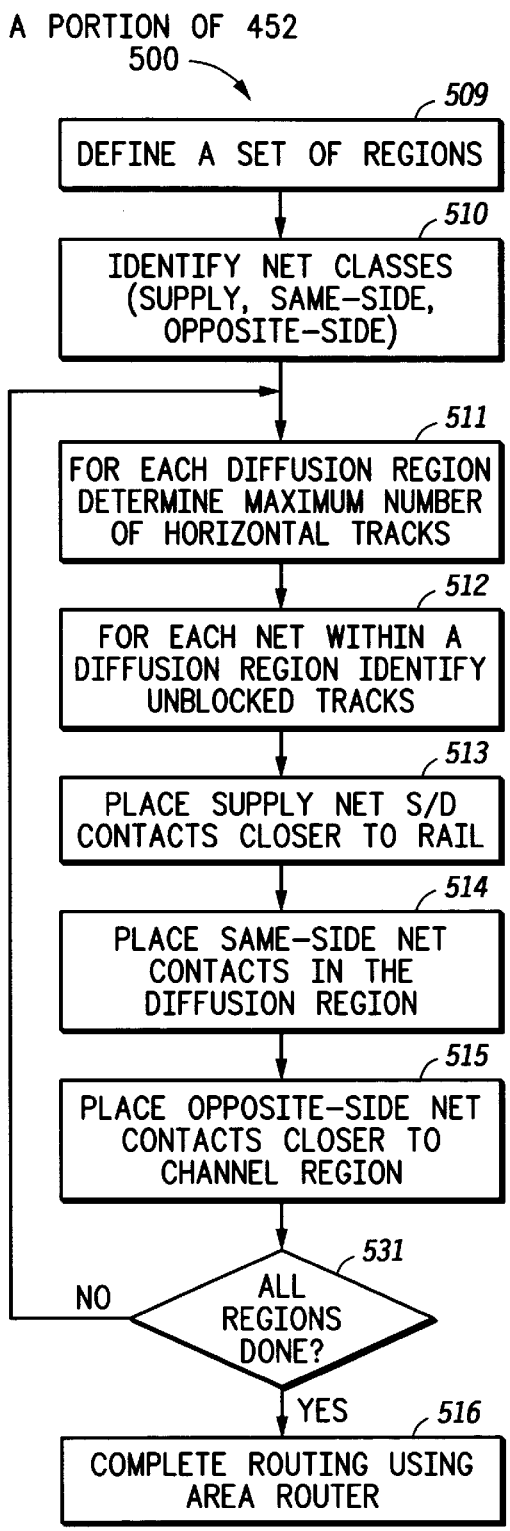
FIG. 5 illustrates, in flow diagram form, a detailed portion of a step of FIG. 4.

The method 500 of FIG. 5 is a portion of the prerouting step 452 of FIG. 4. Upon entry into the prerouting step 452, a step 509 defines a set of regions. An individual region in the set of regions is generally defined to include all transistors of a given diffusion type. For example, in FIG. 7, a P-type Metal Oxide Semiconductor (PMOS) region 711 is defined. In this instance the PMOS region 711 is defined to be from where the single PMOS diffusion 710 interfaces with a channel region 705 and a Supply (Vdd) region 716. It should be noted that region boundaries may coincide with the diffusion boundaries. An N-type Metal Oxide Semiconductor (NMOS) region 712 interface with the channel region 705, and a ground (Gnd) region 717. Generally, regions are defined to include transistors having common diffusion type. However, it may be advantageous to specify multiple regions having a common diffusion type when transistors are stacked. Note the channel region 705 resides between the NMOS region 712 and the PMOS region 711.

Next, at step 510, each net in the standard cell, as defined by the netlist, is classified. Net classifications include supply nets, same-side nets, or opposite-side nets. Supply nets are nets that are to connect contact pins to a power supply rail. For example, referring to FIG. 7, contact pins 731 and 732 are associated with supply nets. Same-side nets are non-supply nets that have contact pins residing in a single region. For example, referring to FIG. 7, the NET-D associated with contact pins 733 and 734 is a same side net. Note that the net has not actually been routed, only defined by the netlist file. Finally, opposite-side nets are nets that are to connect contact pins residing in more than one region. For example, NET-A is associated with contact pins labeled 702, 703 and 704. Even though the contact pins 702 and 703 reside within a common PMOS region 711, the NET-A is considered an opposite-side net because the contact pin 704 resides in a different region (NMOS region 712).

Figure 7:
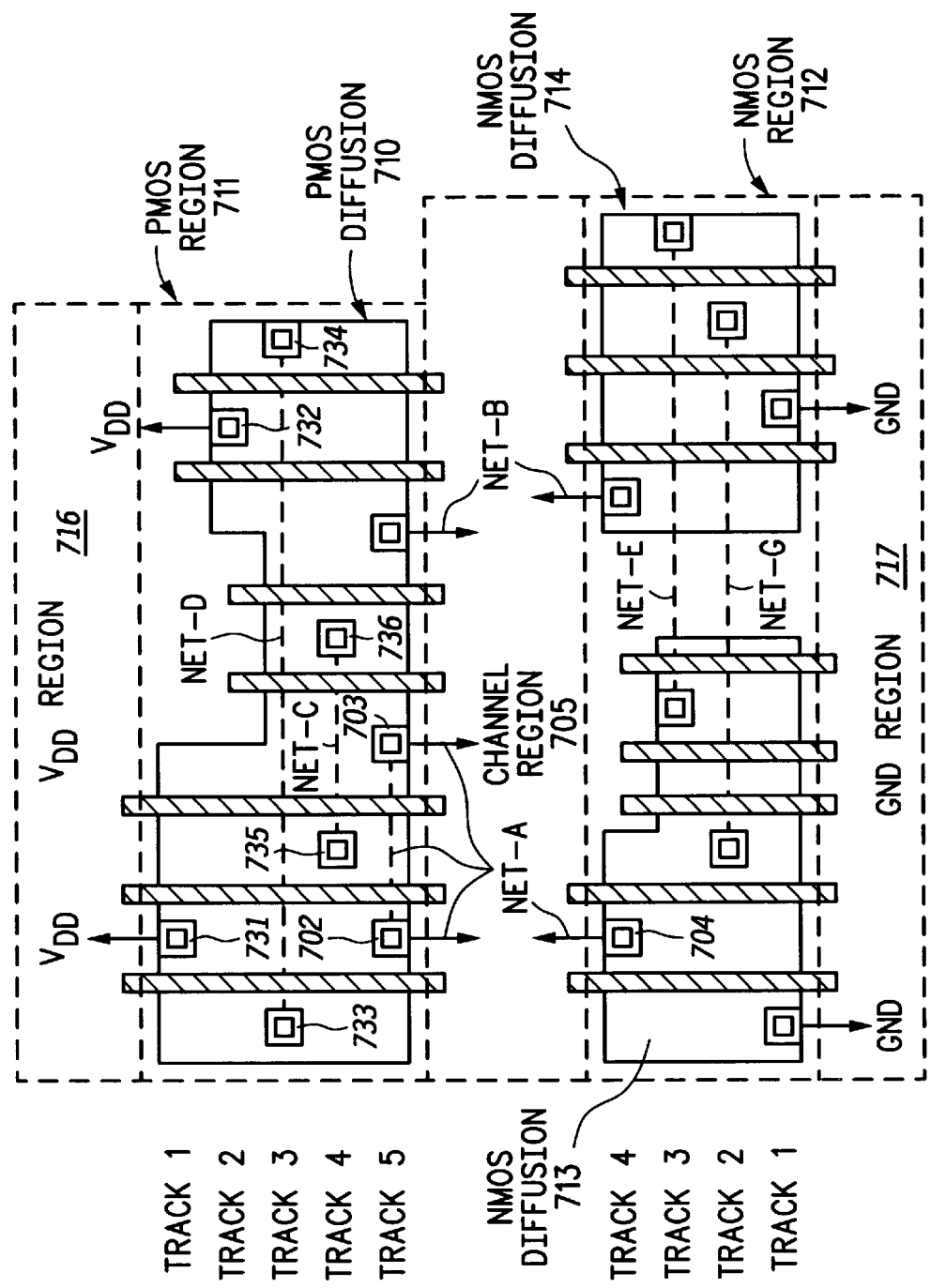
FIG. 7 illustrates, in partial layout form, a circuit portion being optimized using the present invention.

Next, at step 511, for each region, a determination is made as to the maximum number of horizontal tracks available in that region. As illustrated in FIG. 7, the maximum number of horizontal tracks available is the number of horizontal metal routing interconnection that can fit within the region without violating spacing rules. Note, it would be understood by one skilled in the art that the actual orientation is not important and the term horizontal is used for reference purposes only. The PMOS region 711 of FIG. 7 is illustrated to have a maximum of five horizontal tracks available. For NMOS region 712, the maximum number of tracks is illustrated to be four. A track is defined here to be an interconnection width plus a design rule spacing required between two interconnections.

Next, at step 512, unblocked tracks for each individual net are identified. For example, referring to FIG. 7, the contact pins 733 and 734, which are associated with NET-D, are blocked from residing within track 1 because the node 734 must reside within the PMOS region 710. In other words, if the node 734 were moved to track 1, it would no longer reside within the PMOS diffusion 710 and therefore would not make contact with the source/drain region. Therefore, for NET-D, track 1 would be blocked from residing exclusively in track 1. In subsequent steps, as other contact pins are placed in anticipation of shortest length routing, other tracks or partial tracks will be blocked for each net. For example, when contact pins 733 and 734 are placed in track 3, in anticipation of NET-D being routed, the portion, or span, of track 3 between pins 733 and 734 will be reserved for NET-D. This reserved space is considered a blockage to NET-C will be updated to eliminate the locations of contact pins 733 and 734, and the portion of track 3 between these contact pins. This discourages the contact pins of NET-C from being placed between the contact pins of NET-D.

Next at step 513, the contact pins associated with each individual supply Let are placed in the track closest to the supply rail. In FIG. 7, contact 731 is placed in track 1 and contact 732 is placed in track 2. The term "placing" does not necessarily indicate that a contact pin has been physically placed or added to a design file, but rather indicates that a placement location has been reserved for that individual contact pin for later placement. As part of step 513, the blockage information is updated for all nets having a contact pin in the region. Once all of the nodes associated with power supply nets have been placed, the flow proceeds to step 514.

At step 514, all same-side nets are placed within their respective regions. For example, referring to FIG. 7, the nodes associated with NET-D and NET-C are placed within the PMOS region 711 during step 514. Next, at step 515, following the placement of all same-side nets, the placement of opposite-side nets is performed. Referring to FIG. 7, the nets A and B would be placed during the step 515. In a preferred embodiment, the same side nets are placed in an available track furthest from the channel region, while opposite-side nets are placed in an available track closest to the channel region.

Next, at step 531, a determination is made whether or not all regions associated with the standard cell have been completed. For example, the circuit of FIG. 7 has two regions requiring the steps 511 through 515 being repeated twice.

Next, at step 516, any remaining routing steps are completed. These additional routing steps include other pre-routing steps as well as the detailed area routing which connects the contact pins based on the netlist connectivity.

Figure 6:
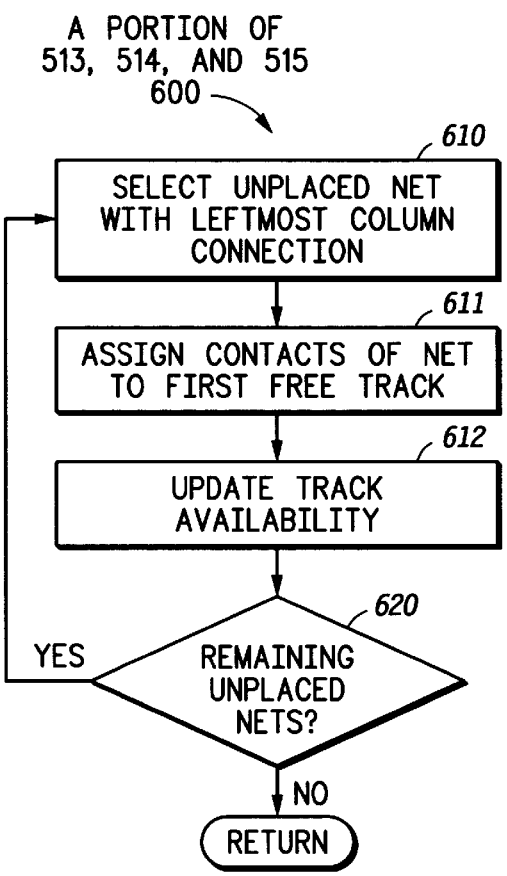
FIG. 6 illustrates, in flow diagram form, a portion of several steps of FIG. 5 greater detail.

FIG. 6 illustrates sub-steps associated with each of the steps 513, 514, and 515 of FIG. 5. The method 600 illustrated in FIG. 6 identifies a specific implementation used to place the contact pins in accordance with the present invention.

At a step 610, an unplaced net under consideration with a contact pin at a leftmost column connection is selected. For example, in step 513, the supply net furthest left will be selected, while in steps 514 and 515, same-side nets and opposite-side nets are selected respectively. For example in FIG. 7, in the PMOS region 711, the NET-D would be selected for routing because it has a contact pin 733 associated with the left-most source/drain of the PMOS region 711. Note that the term "column" refers to the individual source/drain regions which reside in the vertical areas between the transistor gates. Once a net is selected, the method 600 proceeds to step 611 which assigns the contact pins associated with the net to the first free track.

The term "first free track" is relative depending upon whether an opposite-side net, a supply net, or a same-side net is being placed. With reference to FIG. 7, the first free track for a power supply pin of PMOS region 711 would be the track closest to the Vdd region 716, which is near the top of the PMOS region 711 as illustrated. However, for the NMOS region 712, the supply pins would be referenced to the track closest the GND region 717, which is near the bottom of the NMOS region 712. Same-side nets would reference the first available track in a similar fashion as done for power supply nets, in that the first available track will be the track closest to the power supply rail associated with that region. However, for opposite side net placement, the first available track is defined to be the track closest to channel region 705. This creates an advantage over the prior art, in that nets are divided into classes, and the contact pins associated with each class are placed in a nonconflicting manner.

Next, in step 612, the track availability or blockage for each of the nets remaining to be routed is updated. As previously discussed, the area of a specific track as defined in step 611, which presumably will be occupied by interconnect wire, needs to be removed from consideration for any subsequent contact placement considerations. For example, referring to FIG. 7, if contact pins of NET-D have been placed as illustrated, the portion of track 3 residing between the contact pin 733 and the contact pin 734 needs to be removed from consideration for the placement of NET-C in that NET-C will not be able to reside on the same track as NET-D, because NET-D is anticipated to use the entire track during future routing step 516 in FIG. 5. It should be noted, however, if the NET-D were to connect nodes in adjacent columns, only the space between the adjacent columns within the track would need to be removed from consideration for placement of the contact pins of NET-C. Next, at step 620, a determination is made whether or not there are any unplaced nets in the class of nets being considered. If there are remaining unplaced nets, the flow proceeds back to step 610 where the net having the next left-most contact pin is selected for placement. The flow will proceed until no remaining unplaced nets exist in which case the flow will return to its associated step 513, 514, or 515 of FIG. 5.

There may not be enough routing track available in the transistor region to place contacts of all nets such that the final interconnections of the nets occupy a single unique routing track. In such a situation, nets will be divided into sub-nets and contacts of each sub-net may be placed in a different track.

Figure 8:
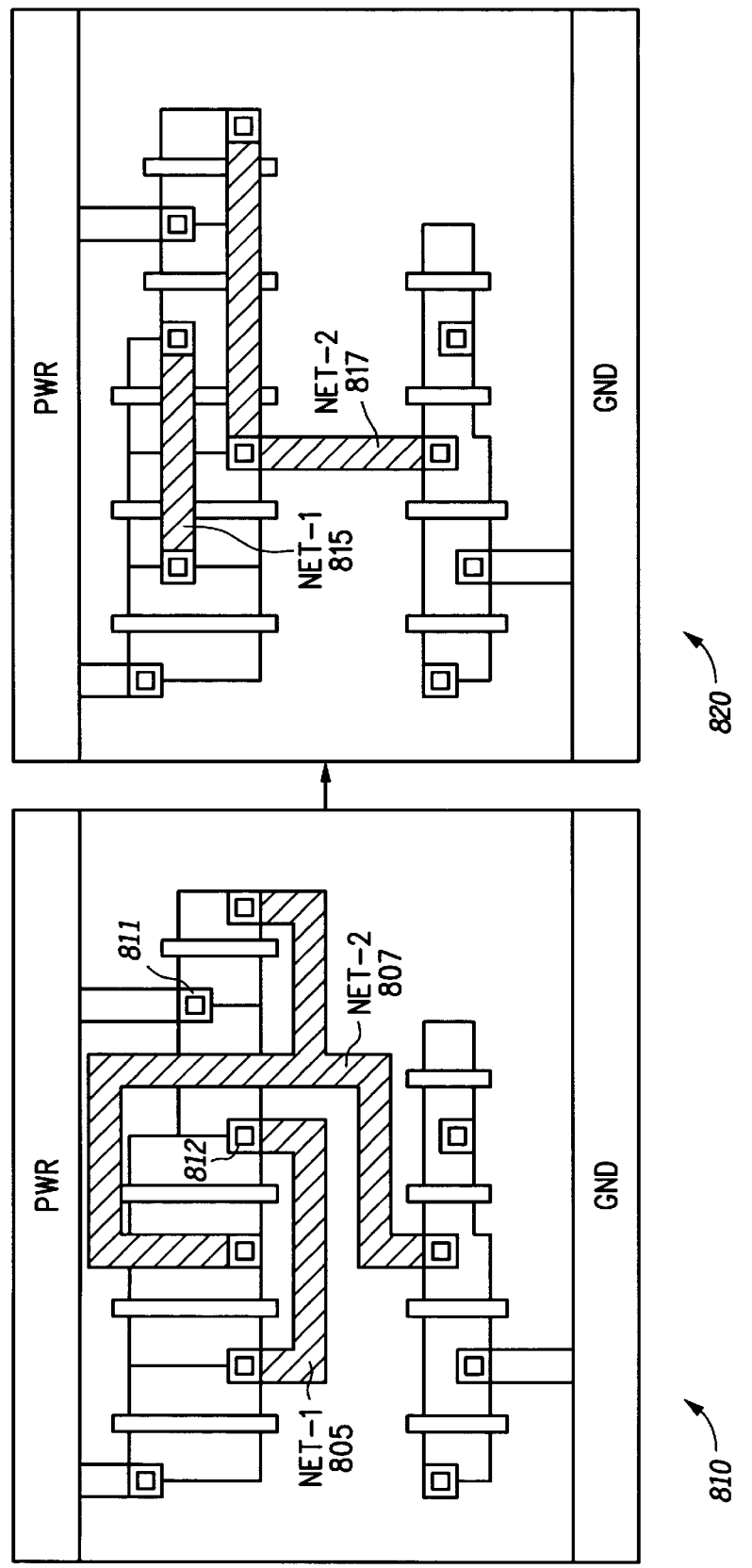
FIG. 8 illustrates, in partial layout form, a comparison between a non optimized circuit portion and a circuit portion being optimized using the present invention

By affecting placement in the manner described with reference to the methods 500 and the sub method 600, the contact pins are placed in an optimal manner such that subsequent routing is not dependent upon net ordering, because each net tends to have a unique optimal independent route. For example, referring to FIG. 8, an unoptimized prior art contact pin placement of standard cell 810 is illustrated and contrasted to an optimized contact pin placement standard cell portion 820. Note that in the optimized cell portion 820, the overall interconnection lengths of NET-1 and NET-2 have been optimized. It should be further noted that the order of routing NET-1 and NET-2 has no affect on the overall routing. This is an advantage over the prior art solution which is route order dependent.

The present invention also allows optimization of the area of the standard cell portion of 820. This is illustrated in standard cell 820 in that there are two horizontal tracks used for the routines of NET-1 815 and NET-2 817 in portion 820.

Contrast this to the standard cell portion 810, which uses three horizontal track portions to route the same two nets. The additional track reduces the ability of further compaction by compaction tools, step 456 of FIG. 4. In addition, a similar optimization can occur in the vertical axis as well. For example, referring again to FIG. 8, there is a single vertical track associated with NET-2 817 in the optimized standard cell portion 820. Contrast this to that of non-optimized standard cell portion 810 which has three vertical tracks associated with NET-2 807. This, in turn, limits the ability to compact the design in that there is an additional vertical component associated with NET-2 807, which resides between contact pin 811 and contact pin 812, which prevents the contacts 811 and 812 from being placed closer to one another. Therefore, it is readily apparent that the present invention offers an improvement over the prior art.

Figure 1:
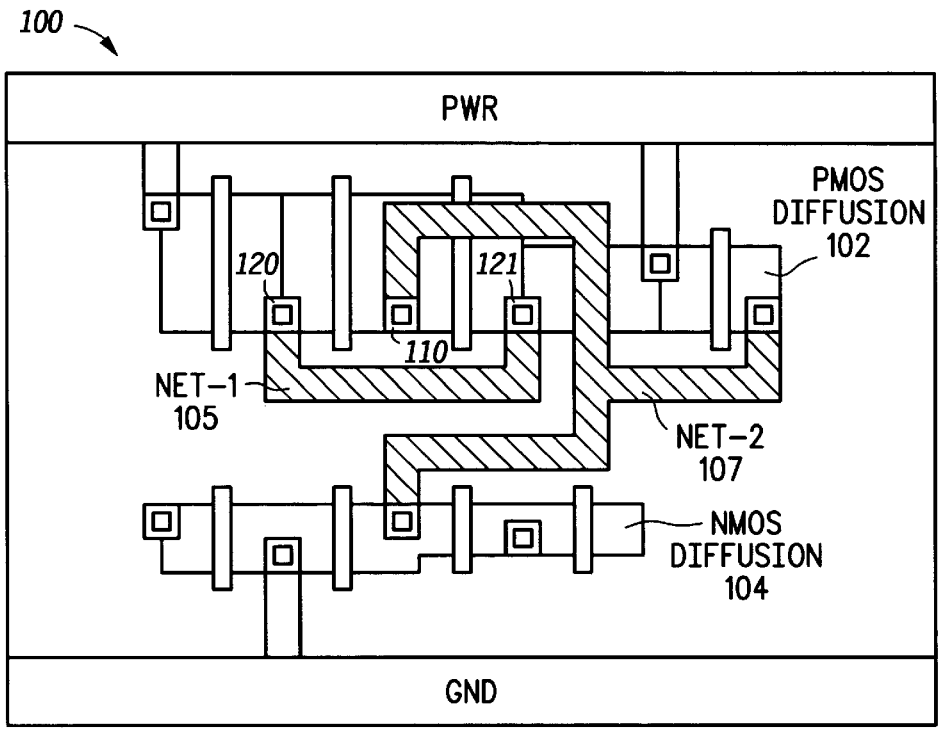
FIG. 1 illustrates, in partial layout form, a non-optimized prior art integrated circuit layout.
Figure 2:
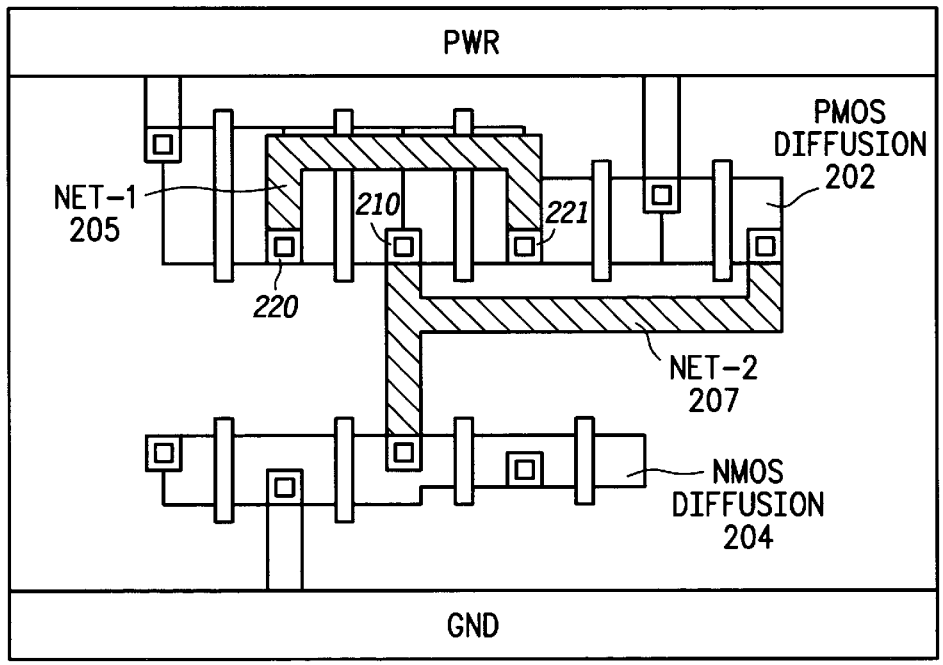
FIG. 2 illustrates, in partial layout form, an optimized prior art integrated circuit layout.
Figure 9:
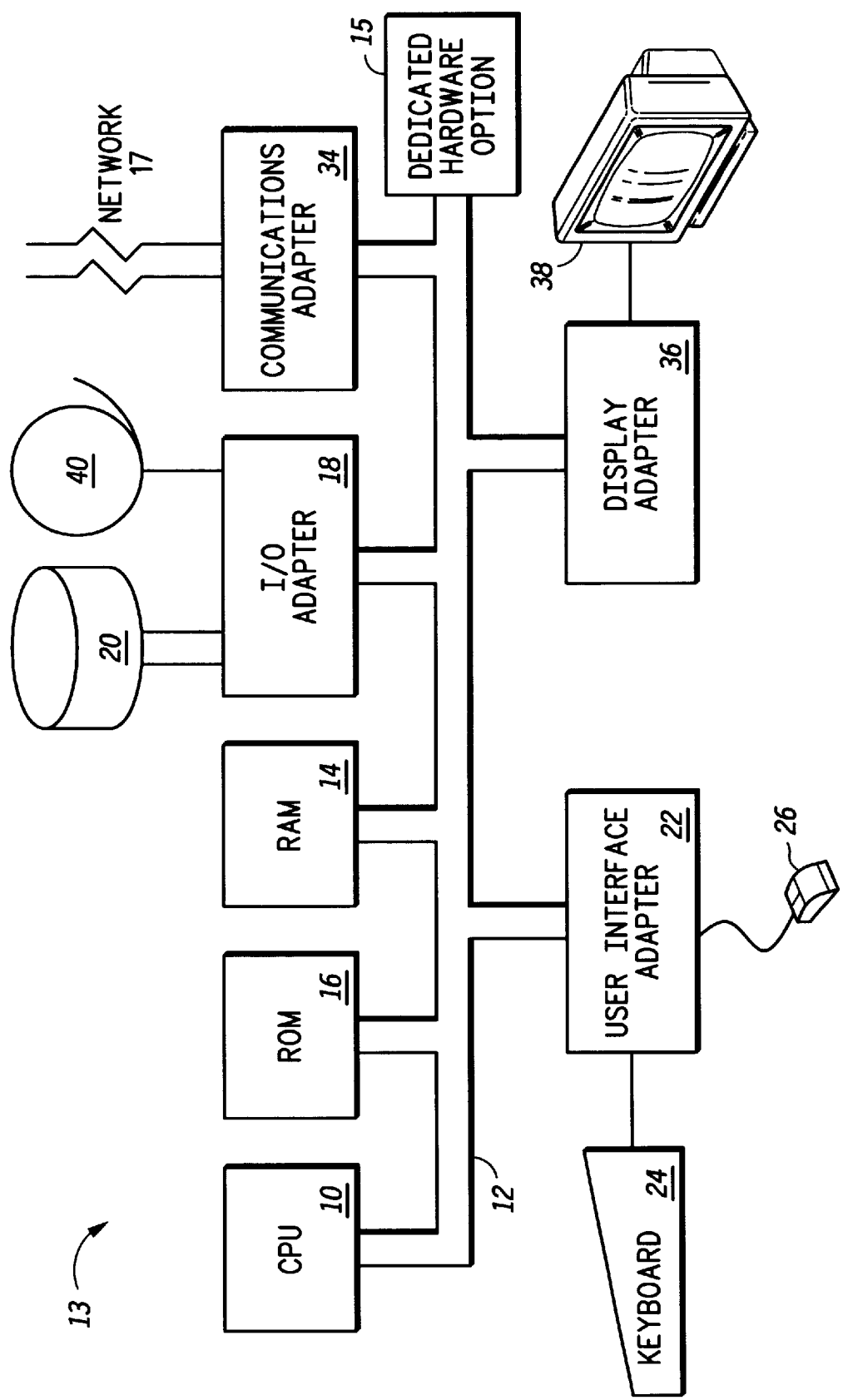
FIG. 9 illustrates, in block diagram form, a system capable of implementing the present invention.

The various methods discussed above may be implemented within dedicated hardware 15 as illustrated in FIG. 9 or within processes implemented within a data processing system 13. A typical hardware configuration of a workstation which may be implemented to accomplish the methodologies disclosed herein, is illustrated and includes a central processing unit (CPU) 10, such as a conventional microprocessor, and a number of other units connected via system bus 12. The workstation shown in FIG. 1 includes random access memory (RAM) 14, read only memory (ROM) 16, and input/output (I/O) adapter 18 for connecting peripheral devices, such as disk units 20 and tape units 40, to bus 12. A user interface adapter 22 is used to connect a keyboard device 24 and a mouse 26 to the system bus 12. Other user interface devices such as a touch screen device (not shown) may also be coupled to the system bus 12 through the user interface adapter 22.

A communication adapter 34 is also shown for connecting the workstation to a data processing network 17. Further, a display adapter 36 connects the system bus 12 to a display device 38. The method of the present invention may be implemented and stored in one or more of the disk units 20, tape drives 40, ROM 16 and/or RAM 14, or even made available to system 13 via a network connection through communications adapter 34 and thereafter processed by CPU 10. Since the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Figure 10:
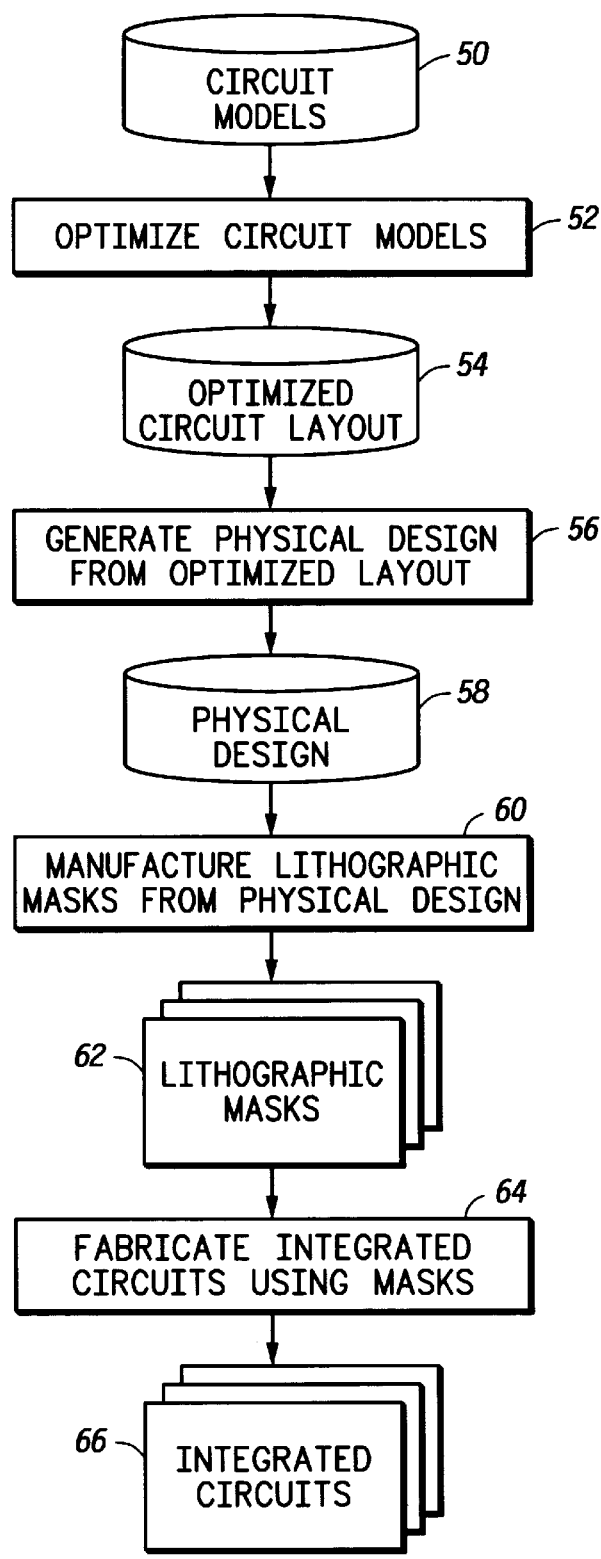
FIG. 10 illustrates, in flow form, a method for manufacturing a semiconductor device in accordance with the present invention.

FIG. 10 is a block diagram that illustrates integrated circuit fabrication utilizing the optimized cell layout tool 52 disclosed in FIG. 4. The optimized cell layout tool 52 utilizes a circuit layout 50 to generate an optimized circuit layout 54. A physical design file 58 is generated 56 from the optimized circuit layout 54. The circuit layout 50, optimized circuit layout 54, and physical design 58 are typically stored as data files on computer readable media such as disk units 20. The physical design file 58 includes integrated circuit dimensions, element dimensions, and element locations within the integrated circuit. The physical design file 58 locates elements and connections within a two-dimensional substrate area of an integrated circuit die. Preferably, the physical design file 58 includes physical structure for performing the functions of an integrated circuit design from which the physical design file 58 was derived. The physical design 58 is converted 60 into a set of lithographic masks 62 corresponding to the layers in the physical design file 58.

The lithographic masks 62 are used to fabricate 64 integrated circuits 66.

The methods taught herein are used to generate CAD (computer aided design) data files which contain information regarding an integrated circuit and placement of gates, transistors, and the like in the integrated circuit. These files are then used to form lithographic masks which are then used to form a plurality of integrated circuits on a plurality of wafers using an integrated circuit fabrication facility. The design phase is taught in "*Principles of CMOS VLSI Design: A Systems Perspective*", by N. H. E. Weste and K. Eshragian in the VLSI Series by Addison-Wesley, 1985. Fabrication techniques are outlined in "*Silicon Processing for the VLSI Era*, Volume 1: *Process Technology*", by Wolf and Tauber, copyright 1986, published by Lattice Press. Process integration is taught by the second book in the series: "*Silicon Processing for the VLSI Era*, Volume 2: *Process Integration*", by Wolf, copyright 1990, published by Lattice Press.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A method for optimizing a semiconductor circuit based upon a netlist and component placement information, the method comprising:

identifying a first net of a plurality of nets associated with a first circuit region having at least a first contact pin associated with a first contact pin region;

identifying a second contact pin associated with a second contact pin region when the first net comprises a plurality of contact pins;

determining a net class for the first net based upon the first contact pin region and the second contact pin region, wherein the first net has a first net class if the first contact pin region and the second contact pin region are the same, the first net has a second net class if the first contact pin region and the second contact pin region are different;

the first net has a third net class if the first contact pin region is defined by the netlist to be connected to a power supply;

placing the first net if the first net has a third net class;

placing the first net if the first net has a first net class; and placing the first net if the first net has a second net class.

2. A method for optimizing a semiconductor circuit based upon a netlist and component placement information, the method comprising:

identifying a first circuit region and a second circuit region;

identifying a first net associated with the first circuit region having a first plurality of contact pins including a first contact pin and a second contact pin, wherein the first contact pin has a first contact pin region associated with either the first circuit region or the second circuit region and the second contact pin has a second contact pin region associated with either the first circuit region or the second circuit region;

determining a net class for the first net based upon the first contact pin region and the second contact pin region, wherein the first net has a first net class if the first contact pin region and the second contact pin region are the same, the first net has a second net class if the first contact pin region and the second contact pin region are different; and placing the first plurality of contact pins based upon the net class.

3. The method of claim 2, wherein the step of placing further comprises the substeps of:

determining a set of available tracks for the first net, wherein the set of available tracks defines where the first net may physically reside;

defining an order of the set of available tracks from a first track to a last track based upon the net class;

assigning the first plurality of contact pins to a first available track, wherein the first available track is in the set of available tracks when the net class is of the first net class; and assigning the first plurality of contact pins to a first available track, wherein the first available track is in the set of available tracks when the net class is of the second net class.

4. The method of claim 3, wherein the step of defining an order further comprises:

assigning the first track to be a track nearest a power supply region when the first net has a first net class, and assigning the first track to be a track furthest from the power supply region when the first net has a second net class.

5. The method of claim 3, further comprising the step of:

redefining the set of available tracks for a second net.

6. The method of claim 3, wherein the step of assigning the first plurality of contact pins when the net class is of the first net class further comprises:

assigning a first plurality of contact pins to a first available track, wherein the first available track is in the set of available tracks, and all of the first plurality of contact pins can reside in the first available track; and assigning a first number of the plurality of contact pins to the first available track, wherein the first number is less than a total number representing the plurality of contact pins.

7. The method of claim 6, further comprising the step of:

assigning a first predetermined number of the plurality of contact pins to a first available track and assigning a second predetermined number of the plurality of contact pins to a second available track, wherein a total of the first predetermined number and the second predetermined number is no greater than the total number representing the plurality of contact pins.

8. The method of claim 3, wherein the step of determining further comprises the set of available tracks comprising partial tracks, wherein only a portion of a specific track is available.

9. The method of claim 1, wherein the first circuit region and the second circuit region are diffusion regions.

10. The method of claim 1 further comprising the steps of:
identifying a second net associated with the first circuit region having a plurality of contact pins including a third contact pin and a fourth contact pin, wherein the third contact pin has a third contact pin region associated with one either first circuit region or the second circuit region and the fourth contact pin has a fourth contact pin region associated with either the first circuit region or the second circuit region; and determining a net class for the second net based upon the third contact pin region and the fourth contact pin region, wherein the second net has a first net class if the third contact pin region and the fourth contact pin region are the same; and the second net has a second net class if the third contact pin region and the fourth contact pin region are different.

11. The method of claim 10, wherein the step of placing further comprises placing the first contact pin and second contact pin prior to placement of the third contact pin and the fourth contact pin when the first net has a first net class, and the second net has a second net class.

12. The method of claim 10, wherein the step of placing further comprises placing the first contact pin and second contact pin prior to the third contact pin and the fourth contact pin based upon a selection criteria when the first net and the second net have a same net class.

13. The method of claim 12, wherein the step of placing further comprises the selection criteria chooses a net nearest a predefined circuit location.

14. The method of claim 13, wherein the step of placing further comprises the selection criteria choosing a net having a predefined net characteristic.

15. The method of claim 14, wherein the step of placing comprises the predefined net characteristic identifying a net having a maximum number contact pins associated with it.

16. A data processing system comprising:
a means for receiving a netlist and placement information for a semiconductor circuit;
a means for identifying a first circuit region and a second circuit region in the netlist and placement information;
a means for identifying a first net associated with the first circuit region having a first plurality of contact pins including a first contact pin and a second contact pin, wherein the first contact pin has a first contact pin region associated with either the first circuit region or the second circuit region and the second contact pin has a second contact pin region associated with either the first circuit region or the second circuit region;
a means for determining a net class for the first net based upon the first contact pin region and the second contact pin region, wherein
the first net has a first net class if the first contact pin region and the second contact pin region are the same,
the first net has a second net class if the first contact pin region and the second contact pin region are different; and
a means for placing the first plurality of contact pins based upon the net class.

17. A method for optimizing a semiconductor circuit comprising:
receiving a netlist and placement information for the semiconductor circuit, wherein the netlist identifies a plurality of nets;
identifying a first net set comprising any nets in the plurality of nets to be coupled to a power supply;
identifying a second net set comprising any nets in the plurality of nets having all contact pins in a first diffusion region;
identifying a third net set comprising any nets in the plurality of nets having at least one contact pin in a first diffusion region, and at least one contact pin in a second diffusion region, wherein the first diffusion region is different than the second diffusion region;
placing any nets in the first net set;
placing any nets in the second net set; and
placing any nets in the third net set.

18. The method of claim 17, wherein the step of placing any nets in the second net set occurs after the step of placing any nets in the first net set, and the step of placing any nets in the third net set occurs after the step of placing any nets in the second net set.

19. A method for manufacturing a semiconductor device, the method comprising the steps of:
positioning a semiconductor device substrate having a photoresist layer into an imaging tool;
positioning a mask having a mask image into the imaging tool, wherein the mask image identifies contact pin locations for the semiconductor device, and at least a portion of the contact pin locations where determined by:
receiving a netlist and placement information for a semiconductor device portion;
identifying a first device portion region and a second device portion region;
identifying a first net associated with the first device portion region having a first plurality of contact pins including a first contact pin and a second contact pin, wherein the first contact pin has a first contact pin region associated with either the first device portion region or the second device portion region and the second contact pin has a second contact pin region associated with either the first device portion region or the second device portion region;
determining a net class for the first net based upon the first contact pin region and the second contact pin region, wherein
the first net has a first net class if the first contact pin region and the second contact pin region are the same,
the first net has a second net class if the first contact pin region and the second
contact pin region are different;instructions placing the first plurality of contact pins based upon the net class;
storing a design database specifying a placement of the first plurality of contact pins;
generating a contact pin mask based on the design database;
exposing the photoresist layer to the mask image;
etching the photoresist layer to form a photoresist mask identifying contact pin locations; and forming contact pins on the semiconductor device substrate at the contact pin locations.

20. A computer readable medium containing software to be executed by a computer, said software comprising:

a set of instructions for receiving a netlist and placement information for a semiconductor circuit;

a set of instructions for identifying a first circuit region and a second circuit region;

a set of instructions for identifying a first net associated with the first circuit region having a first plurality of contact pins including a first contact pin and a second contact pin, wherein the first contact pin has a first contact pin region associated with either the first circuit region or the second circuit region and the second contact pin has a second contact pin region associated with either the first circuit region or the second circuit region;

a set of instructions for determining a net class for the first net based upon the first contact pin region and the second contact pin region, wherein the first net has a first net class if the first contact pin region and the second contact pin region are the same, the first net has a second net class if the first contact pin region and the second contact pin region are different; and a set of instructions for placing the first plurality of contact pins based upon the net class.

* * * * *